United States Patent [19]
Avramis et al.

[11] Patent Number: 6,094,359
[45] Date of Patent: Jul. 25, 2000

[54] HF HOUSING

[75] Inventors: Evangelos Avramis, Bochum; Peter Matuschik, Duisburg, both of Germany; Ronald Schiltmans, Eindhoven, Netherlands

[73] Assignee: U.S. Philips Corporation, New York, N.Y.

[21] Appl. No.: 09/159,990

[22] Filed: Sep. 24, 1998

[30] Foreign Application Priority Data

Sep. 27, 1997 [DE] Germany .................. 197 42 829

[51] Int. Cl.⁷ .................. H05K 7/12; H05K 1/14
[52] U.S. Cl. .................. 361/796; 361/736; 361/784; 361/789; 361/803; 361/814; 439/65; 439/76.1; 439/493; 333/246; 343/702; 455/347
[58] Field of Search .................. 361/736, 749, 361/750–752, 784, 785, 789, 796, 803, 814; 439/61, 65, 67, 76.1, 493, 916, 77; 174/52.1, 254; 343/700 MS, 702, 872; 333/1, 12, 246, 247, 32, 33; 206/701, 706, 707; 455/347–349, 351, 3.1, 3.2, 3.3, 4.1, 4.2, 5.1, 6.1, 6.2, 6.3; 348/6–11

[56] References Cited

U.S. PATENT DOCUMENTS

| | | | |
|---|---|---|---|
| 4,143,342 | 3/1979 | Cain et al. | 333/246 |
| 4,658,439 | 4/1987 | Danielsen et al. | 455/351 |
| 4,811,082 | 3/1989 | Jacobs et al. | 257/700 |
| 5,093,985 | 3/1992 | Houldsworth et al. | 439/493 |
| 5,122,065 | 6/1992 | Dudek et al. | 439/76.1 |
| 5,263,868 | 11/1993 | Renn et al. | 439/77 |
| 5,428,191 | 6/1995 | Chandler et al. | 439/65 |
| 5,438,690 | 8/1995 | Tsukuda | 455/347 |
| 5,521,794 | 5/1996 | Hargrave et al. | 361/784 |
| 5,523,695 | 6/1996 | Lin | 439/493 |
| 5,675,300 | 10/1997 | Romerein | 361/736 |
| 5,742,484 | 4/1998 | Gillette et al. | 361/789 |
| 5,764,497 | 6/1998 | Mizumo | 439/65 |
| 5,917,149 | 6/1999 | Barcley et al. | 439/67 |

Primary Examiner—Leo P. Picard
Assistant Examiner—John B. Vigushin
Attorney, Agent, or Firm—Gregory L. Thorne

[57] ABSTRACT

The invention relates to a HF housing comprising an arrangement for electrically interconnecting at least two HF conductor tracks (18, 19) which are formed on adjacent printed circuit boards (13, 15), which are separated from each other by a slit (17), and whose ends are situated opposite each other in the region of the slit. A simple way of interconnecting the conductor tracks (18, 19) situated opposite each other in the slit region is achieved in accordance with the invention by an auxiliary printed circuit board (20) which bridges the slit region and is pressed against the printed circuit boards (13, 15), the lower side of said auxiliary printed circuit board being provided with auxiliary contact bridges (21) in the region of the HF conductor tracks (18, 19) to be interconnected.

17 Claims, 4 Drawing Sheets

HF HOUSING

BACKGROUND OF THE INVENTION

The invention relates to a HF housing comprising an arrangement for electrically interconnecting at least two HF conductor tracks which are formed on adjacent printed circuit boards, which are separated from each other by a slit, and whose ends are situated opposite each other in the region of the slit.

In the high-frequency technique, it is often necessary to electrically interconnect two printed circuit boards made of different starting materials and having different dielectric constants $\in_R$. For this purpose, the local conductor tracks present on the printed circuit boards are interconnected in known manner by means of so-called bonding. In this bonding process, a joint is formed by ultrasonic welding in that the two conductor tracks which are to be interconnected and situated on different printed circuit boards are interconnected by very thin gold wires. Such a method is intricate, time-consuming and expensive. Such a special welding process is necessary for, for example, printed circuit boards which are constructed for use in different frequency ranges. Conventional soldered joints are unsuitable for electrically interconnecting such printed circuit boards because they do not satisfy high-frequency conditions.

SUMMARY OF THE INVENTION

It is an object of the invention to provide a simple arrangement for electrically interconnecting such HF conductor tracks in a HF housing of the type mentioned in the opening paragraph.

In accordance with the invention, this object is achieved in a HF housing of the type mentioned in the opening paragraph by an auxiliary printed circuit board which bridges the slit region and is pressed against the printed circuit boards, the lower side of said auxiliary printed circuit board being provided with auxiliary contact bridges in the region of the HF conductor tracks to be interconnected. The making of such HF connections does not require an intricate and expensive solder machine. The electrical HF connection between the conductor tracks is formed merely by mechanical pressure exerted on the auxiliary printed circuit board, thus causing the facing conductor tracks to be electroconductively interconnected in a reliable and failsafe manner.

The characteristics described in claim 2 enable a reliable, simple connection to be readily made between the conductor tracks formed on two printed circuit boards which, within a two-part HF module, are arranged in a fixed position. The contact pressure is generated in that the cover part, which is present anyhow, is provided with protuberant portions in the region of the conductor tracks to be interconnected, which protuberant portions are pressed onto the auxiliary printed circuit board when the lower part and the cover part are being mechanically interconnected, so that the auxiliary conductor tracks arranged at the lower side of the auxiliary printed circuit board interconnect the HF conductor tracks of the two printed circuit boards. As regards this connection, the portions of the cover part engaging the rear side of the auxiliary printed circuit board must demonstrate a protuberance such that there is sufficient contact pressure, also if the lower part and the cover part are rigidly joined.

By virtue of the characteristics described in claim 3, the cover part and the lower part can be interconnected in a simple manner and the protuberant portions of the cover part can be reliably pressed onto the rear side of the auxiliary printed circuit board.

The characteristics described in claim 4 enable, on the one hand, both housing portions and, on the other hand, the printed circuit boards and the auxiliary printed circuit board to be mutually arranged in an absolutely reliable manner. In this connection, the pins are preferably arranged in the lower part of the housing. This means that, in the mounting operation, first the two printed circuit boards are arranged on top of the lower part of the housing and, subsequently, the auxiliary printed circuit board, guided by relevant pins, is provided on the slit region separating the two opposite printed circuit boards. Next, the upper portion of the housing is provided and, subsequently, both housing portions are interconnected preferably, in the manner described in claim 3, by screwing.

By the characteristics described in claim 5, it is achieved that the contact pressure is accurately exerted only in the region of the conductor tracks to be electrically interconnected.

A particularly reliable embodiment enabling a reliable HF connection to be made between two opposite HF conductor tracks is achieved by the characteristics described in claim 6. According to said characteristics, contact pressure is predominantly exerted only in the region of the two end portions of the auxiliary board bridges arranged on the auxiliary printed circuit board.

By virtue of the characteristics described in claim 7, tilting when the two housing portions are being pressed together is precluded.

The characteristics described in claim 8 enable printed circuit boards of different thicknesses to be arranged in a simple manner such that the conductor tracks of the two printed circuit boards to be interconnected are situated in one plane.

BRIEF DESCRIPTION OF THE DRAWINGS

In the drawing, an embodiment of the object in accordance with the invention is schematically represented in FIGS. 1 through 4.

DESCRIPTION OF THE PREFERRED EMBODIMENTS

Figure 1:
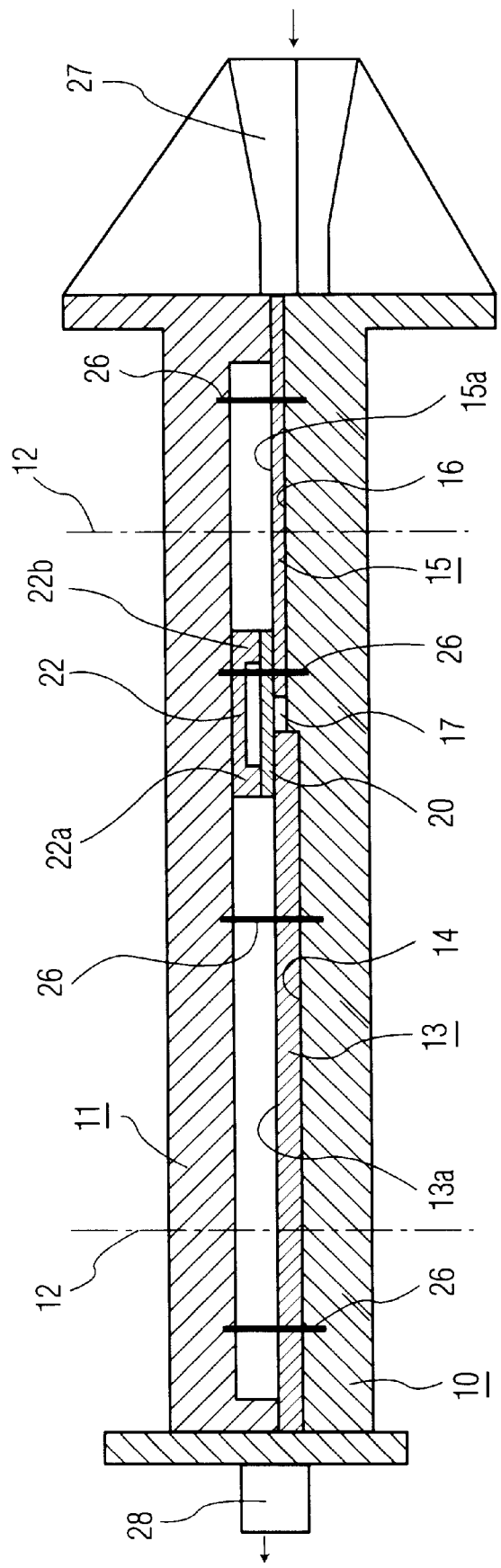
FIG. 1 is a cross-sectional view of a two-part HF housing comprising a bottom portion and a top portion.
Figure 2:
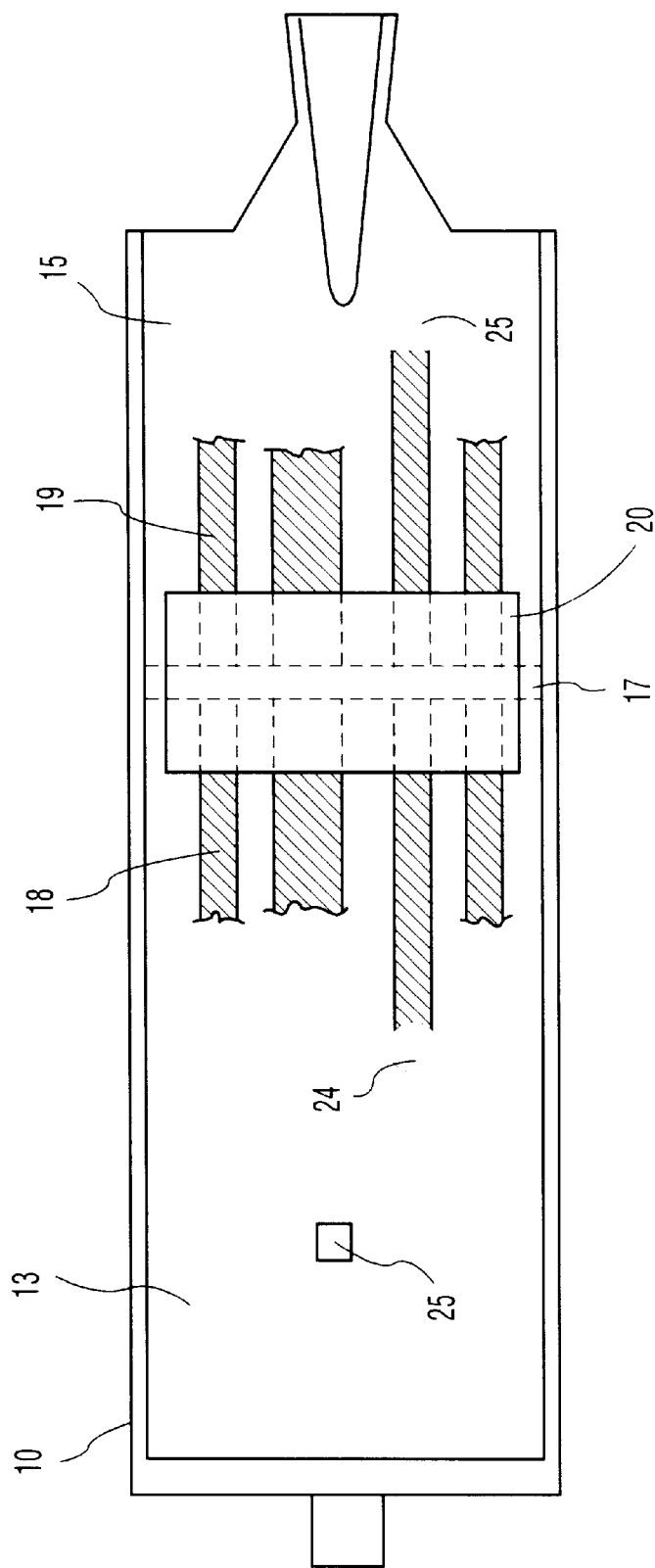
FIG. 2 is a plan view of the interior of the lower portion of the housing accommodating printed circuit boards.
Figure 3:
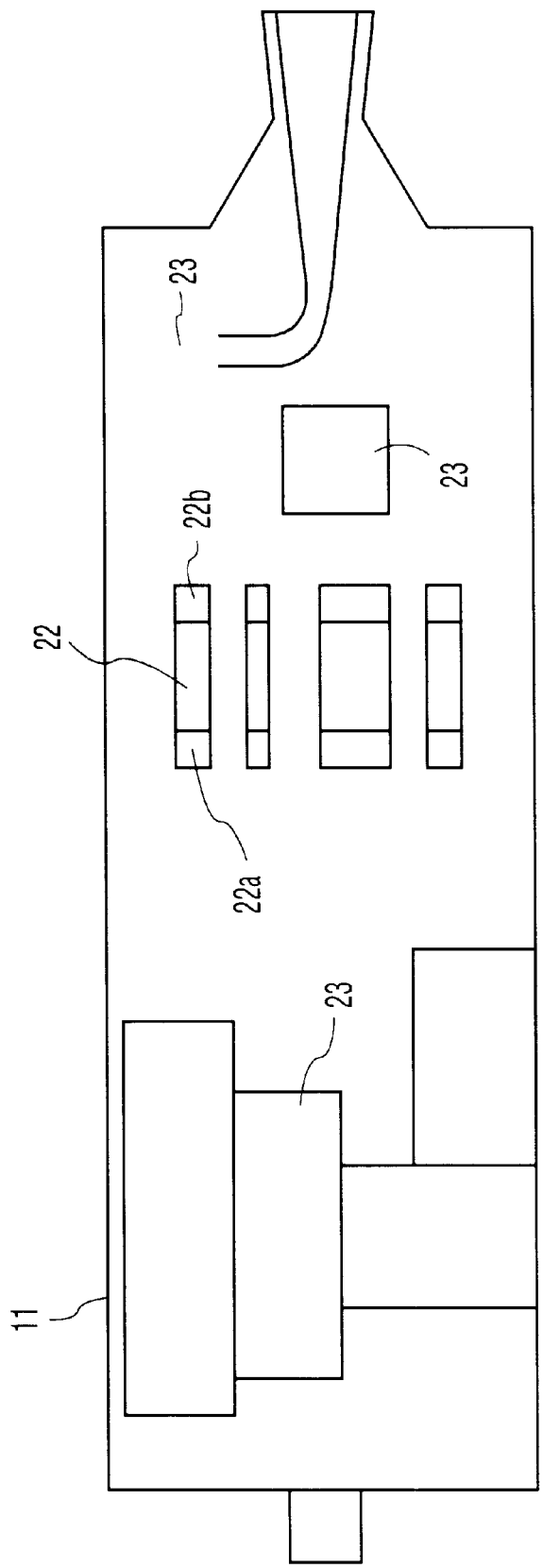
FIG. 3 is a plan view of the interior of the cover portion of the housing.
Figure 4:
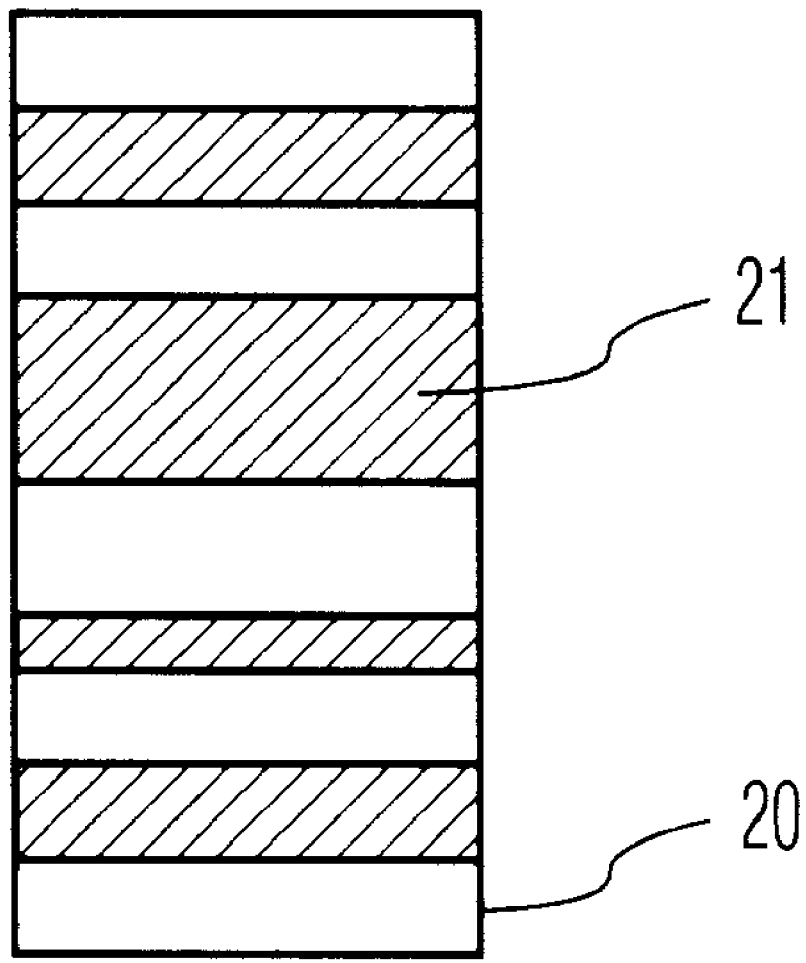
FIG. 4 is a plan view of an auxiliary printed circuit board.

As shown in FIGS. 1 through 4, the HF housing (HF module) comprises a lower portion 10 and a cover portion 11 which are rigidly interconnected by means of screws 12. Between said housing portions 10 and 11 there are two printed circuit boards of different thicknesses, namely a first printed circuit board 13, which is accommodated in a recess 14 of the bottom portion 10, and a second printed circuit board 15 which is present on a raised portion 16 of the lower portion 10. The thicknesses of the two printed circuit boards 13, 15 and the recessed portion 14 and the raised portion 16 are attuned to each other in such a manner that the surfaces 13a, 15a of the two printed circuit boards extend in one plane. Both printed circuit boards are separated from each other by a slit 17 and comprise HF conductor tracks 18, 19 which are opposite each other in the region of the slit 17 and are electroconductively interconnected by an auxiliary printed circuit board 20 bridging the slit region. To establish an electric connection, the lower side of the auxiliary printed circuit board 20 is provided with auxiliary conductor tracks 21 which, after the auxiliary printed circuit board 20 has been provided and pressed down, cause the ends of the opposite conductor tracks 18, 19 to be interconnected in a HF manner.

The conductor tracks 18, 19 are electrically interconnected in that protuberant portions 22 of the cover portion 11 cause the auxiliary printed circuit board 20 to be pressed against the end regions of the two printed circuit boards 13, 15, when the two housing portions 10 and 11 are screwed together. As a result, the auxiliary conductor tracks 21 are arranged on the opposite, spaced apart conductor tracks 18, 19, thus ensuring a reliable HF connection. The protuberant portions 22 of the cover portion 11 are, on the one hand, each embodied so as to be discrete elements in the region of two opposed conductor tracks and, on the other hand, are yoke-shaped with two limbs 22a and 22b. Said two limbs 22a, 22b each exert pressure only on the end regions of the auxiliary conductor tracks 21, so that tilting is reliably precluded. To make sure that sufficient pressure is exerted, at least one further intermediate layer (not shown) serving as a printed circuit board may be provided above the auxiliary printed circuit board 20.

Such a HF housing is, for example, a HF module whose cover portion 11 is provided on the inside with chambers 23 which together with components 24, 25 on the printed circuit boards 13, 15 constitute HF circuits. The bottom portion 10 is provided with pins 26 which penetrate into bore holes in the printed circuit boards 13, 15 and in the auxiliary printed circuit board 20, and which pins at least partly end in bore holes in the cover portion to fix it in position. Reference numeral 27 denotes an input and reference numeral 28 an output for an antenna voltage. Such a HF module is employed, for example, in satellite-receiving stations which are commonly referred to as LNB (Low Noise Block) or MVDS (Microwave Video Distribution System).

What is claimed is:

1. A high frequency (HF) housing comprising an arrangement for electrically interconnecting at least two HF conductor tracks which are formed on upper sides of adjacent printed circuit boards, the adjacent printed circuit boards having ends situated opposite each other, the opposite ends defining a slit therebetween; the interconnecting arrangement characterized by an auxiliary printed circuit board having a lower side provided with auxiliary contacts that bridge and electrically interconnect the HF conductor tracks across the slit; a contact pressure applied to the auxiliary printed circuit board that presses the auxiliary printed circuit board against the adjacent printed circuit boards, thereby ensuring reliable contact between the auxiliary contacts and the HF conductor tracks and establishing across the slit the bridged electrical interconnection between the HF conductor tracks, wherein the contact pressure on the auxiliary printed circuit board is exerted by protuberant parts of a cover part of the HF housing rigidly connected to a lower part of the HF housing.

2. An HF housing as claimed in claim 1, characterized in that
the adjacent printed circuit boards and the auxiliary printed circuit board are rigidly attached to the lower part of the HF housing whose cover part and components arranged on the adjacent printed circuit boards jointly constitute HF circuits.

3. An HF housing as claimed in claim 1, characterized in that the cover part and the lower part are interconnected by means of screws.

4. An HF housing as claimed in claim 1, characterized in that the cover part and the lower part and the adjacent printed circuit boards as well as the auxiliary printed circuit board are centered by means of pins.

5. An HF housing as claimed in claim 1, characterized in that the protuberant parts are embodied so as to be separate, discrete raised portions present in each region of two HF conductor tracks to be interconnected.

6. An HF housing as claimed in claim 5, characterized in that the protuberant parts are embodied so as to be yoke-shaped and are provided with two U-shaped limbs which, in the rigidly interconnected state of the cover part and lower part, bridge the slit and are pressed, with their ends, via the auxiliary printed circuit board, onto corresponding ends of the conductor tracks to be interconnected.

7. An HF housing as claimed in claim 1, characterized in that the upper sides of the adjacent printed circuit boards extend in one plane.

8. An HF housing as claimed in claim 7, characterized in that the lower part of the housing for accommodating adjacent printed circuit boards of different thicknesses is of a stepped construction.

9. A high frequency (HF) housing comprising an arrangement for electrically interconnecting at least two HF conductor tracks that are formed on upper sides of adjacent printed circuit boards, the adjacent printed circuit boards having ends situated opposite each other, the opposite ends defining a slit therebetween; the interconnecting arrangement characterized by an auxiliary printed circuit board having a lower side provided with auxiliary contacts that bridge and electrically interconnect the HF conductor tracks across the slit; a contact pressure applied to the auxiliary printed circuit board that presses the auxiliary printed circuit board against the adjacent printed circuit boards, thereby ensuring reliable contact between the auxiliary contacts and the HF conductor tracks and establishing across the slit the bridged electrical interconnection between the HF conductor tracks, wherein a lower part of the HF housing is of a stepped construction to accommodate printed circuit boards of different thicknesses.

10. An HF housing as claimed in claim 9, wherein the contact pressure on the auxiliary printed circuit board is exerted by protuberant parts of a cover part of the HF housing rigidly connected to the lower part.

11. An HF housing as claimed in claim 9, wherein an upper part of the HF housing and the lower part are interconnected by means of screws.

12. An HF housing as claimed in claim 9, wherein a cover part of the HF housing and the lower part and the adjacent printed circuit boards as well as the auxiliary printed circuit board are centered by means of pins.

13. An HF housing as claimed in claim 9, wherein the contact pressure on the auxiliary printed circuit board is exerted by protuberant parts of a cover part of the HF housing rigidly connected to the lower part, and wherein the upper and the lower part are interconnected by means of screws.

14. An HF housing as claimed in claim 9, wherein the contact pressure on the auxiliary printed circuit board is exerted by protuberant parts of a cover part of the HF housing rigidly connected to the lower part, and wherein the cover part and the lower part and the adjacent printed circuit boards as well as the auxiliary printed circuit board are centered by means of pins.

15. An HF housing as claimed in claim 9, wherein the contact pressure on the auxiliary printed circuit board is exerted by protuberant parts of a cover part of the HF housing rigidly connected to the lower part and wherein the protuberant parts are embodied so as to be separate, discrete raised portions present in each region of two HF conductor tracks to be interconnected.

16. An HF housing as claimed in claim 9, wherein the contact pressure on the auxiliary printed circuit board is exerted by protuberant parts of a cover part of the HF housing rigidly connected to the lower part, and wherein the protuberant parts are embodied so as to be yoke-shaped and are provided with two U-shaped limbs which, in the rigidly interconnected state of the cover part and lower part, bridge the slit and are pressed, with their ends, via the auxiliary printed circuit board, onto corresponding ends of the conductor tracks to be interconnected.

17. An HF housing as claimed in claim 9, characterized in that the upper sides of the adjacent printed circuit boards extend in one plane.

\* \* \* \* \*